US011913563B2

(12) United States Patent
Chandrashekar et al.

(10) Patent No.: US 11,913,563 B2
(45) Date of Patent: Feb. 27, 2024

(54) TEMPERATURE ACTUATED VALVE AND METHODS OF USE THEREOF

(71) Applicant: Applied Materials, Inc., Santa Clara, CA (US)

(72) Inventors: Shivaram Chandrashekar, Karnataka (IN); Pallab Karmakar, Karnataka (IN); Amit Sahu, Uttar Pradesh (IN); Kumaresan Nagarajan, Karnataka (IN); Giridhar Kamesh, Karnataka (IN)

(73) Assignee: Applied Materials, Inc., Santa Clara, CA (US)

( * ) Notice: Subject to any disclaimer, the term of this patent is extended or adjusted under 35 U.S.C. 154(b) by 51 days.

(21) Appl. No.: 17/565,882

(22) Filed: Dec. 30, 2021

(65) Prior Publication Data

US 2023/0213109 A1 Jul. 6, 2023

(51) Int. Cl.
*F16K 31/00* (2006.01)
*G05D 23/02* (2006.01)
(Continued)

(52) U.S. Cl.
CPC ........... *F16K 31/002* (2013.01); *G05D 23/02* (2013.01); *H01L 21/67017* (2013.01);
(Continued)

(58) Field of Classification Search
CPC ............. F16K 31/025; F16K 2200/302; F16K 31/002; F16K 1/123; G05D 23/02;
(Continued)

(56) References Cited

U.S. PATENT DOCUMENTS 4,227,646 A * 10/1980 Hart ..................... G05D 23/024
521/902
5,295,660 A 3/1994 Honma
(Continued)

FOREIGN PATENT DOCUMENTS

CN 103782076 A 5/2014
EP 2729721 B1 11/2016
(Continued)

OTHER PUBLICATIONS

International Search Report and Written Opinion for the International Application No. PCT/US2022/053702, dated Apr. 27, 2023, 10 pages.

*Primary Examiner* — Schyler S Sanks
(74) *Attorney, Agent, or Firm* — Lowenstein Sandler LLP

(57) ABSTRACT

Disclosed herein is a temperature actuated valve, including a stationary member and a movable member, wherein the stationary member is configured to receive the movable member. A first flow path is defined between an outer surface of the stationary member and an inner surface of a housing and a second flow path defined by and within the movable member. The temperature actuated valve further includes at least one temperature actuated member having a first end seated against a base of the stationary member and a second end seated against a base of the movable member. The temperature actuated valve further includes a bias member having a first end connected to the base of the stationary member and a second end connected to the base of the movable member, the at least one temperature actuated member configured to compress at a first temperature and expand at a second temperature.

20 Claims, 7 Drawing Sheets

(51) Int. Cl.
*H01L 21/67* (2006.01)
*H01J 37/32* (2006.01)

(52) U.S. Cl.
CPC ..... *H01J 37/3244* (2013.01); *H01J 37/32183* (2013.01); *H01J 37/32724* (2013.01); *H01J 2237/002* (2013.01); *H01J 2237/2007* (2013.01)

(58) Field of Classification Search
CPC ................ G05D 23/024; G05D 23/025; H01L 21/67017; H01J 2237/002
See application file for complete search history.

(56) References Cited

U.S. PATENT DOCUMENTS

| | | | |
|---|---|---|---|
| 5,439,197 | A | 8/1995 | Itoi et al. |
| 5,613,634 | A | 3/1997 | Veronesi et al. |
| 6,926,246 | B2 | 8/2005 | Ginggen |
| 7,971,651 | B2 | 7/2011 | Tanju et al. |
| 8,608,852 | B2 | 12/2013 | Mahadeswaraswamy et al. |
| 9,165,804 | B2 | 10/2015 | Mahadeswaraswamy et al. |
| 10,704,839 | B2 | 7/2020 | Hoang |
| 2009/0200007 | A1 | 8/2009 | Foy et al. |
| 2010/0314457 | A1 | 12/2010 | Todaka et al. |
| 2012/0074126 | A1 | 3/2012 | Bang et al. |
| 2013/0015376 | A1* | 1/2013 | Kocurek ............... F16K 31/002 60/527 |

FOREIGN PATENT DOCUMENTS

| | | |
|---|---|---|
| EP | 2946108 B1 | 3/2017 |
| JP | 2004-204713 A | 7/2004 |
| KR | 980010076 A | 4/1998 |
| KR | 10-1549434 B1 | 9/2015 |

\* cited by examiner

TEMPERATURE ACTUATED VALVE AND METHODS OF USE THEREOF

FIELD

The present disclosure relates to electronic device manufacturing, and more specifically to one or more embodiments of a temperature actuated valve and methods of use thereof.

BACKGROUND

Large semiconductor fabrication plants can use as much as 100 megawatt-hours of power each hour; such plants use as much power in a year as about 50,000 homes. In some markets, electricity can account for 30% of semiconductor fabrication plant operation costs. Such consumption can exceed that of many oil refineries and automotive plants. While the power consumed by semiconductor chips has been reduced significantly over the past years, improvements in energy used during the fabrication process have lagged behind.

Semiconductor manufacturers continue to search for ways to reduce energy consumption by the plants as a whole including reducing energy consumption by process equipment used to perform the various unit operations. For example, modulating coolant flow is an opportunity to reduce the energy footprint of process equipment. There is a need for new components that do not utilize electricity or that utilize a reduced amount of electricity.

BRIEF SUMMARY

According to one or more embodiments, disclosed herein is a temperature actuated valve, comprising a stationary member and a movable member, wherein the stationary member is configured to receive the movable member; a first flow path defined between an outer surface of the stationary member and an inner surface of a housing; a second flow path defined by and within the movable member; at least one temperature actuated member comprising a first end seated against a base of the stationary member and a second end seated against a base of the movable member, wherein the at least one temperature actuated member comprises a shape memory alloy; and a bias member comprising a first end connected to the base of the stationary member and a second end connected to the base of the movable member, the at least one temperature actuated member configured to compress at a first temperature to reduce an opening to the second flow path and to expand at a second temperature to increase an opening to the second flow path.

In some embodiments, disclosed is an electronic device manufacturing system, comprising:

a fluid line comprising a fluid having a variable temperature, the fluid line further comprising a temperature actuated valve comprising: a stationary member and a movable member, wherein the stationary member is configured to receive the movable member; a first flow path defined between an outer surface of the stationary member and an inner surface of a housing; a second flow path defined by and within the movable member; at least one temperature actuated member comprising a first end seated against a base of the stationary member and a second end seated against a base of the movable member, wherein the at least one temperature actuated member comprises a shape memory alloy; and a bias member comprising a first end connected to the base of the stationary member and a second end connected to the base of the movable member, the at least one temperature actuated member configured to compress at a first temperature to reduce an opening to the second flow path and to expand at a second temperature to increase an opening to the second flow path.

In one or more embodiments, disclosed herein is a method of reducing fluid consumption in an electronic device manufacturing system, comprising: flowing a fluid through a temperature actuated valve positioned in a fluid line of the electronic device manufacturing system, the temperature actuated valve comprising: a stationary member and a movable member, wherein the stationary member is configured to receive the movable member; a first flow path defined between an outer surface of the stationary member and an inner surface of a housing; a second flow path defined by and within the movable member; at least one temperature actuated member comprising a first end seated against a base of the stationary member and a second end seated against a base of the movable member, wherein the at least one temperature actuated member comprises a shape memory alloy; and a bias member comprising a first end connected to the base of the stationary member and a second end connected to the base of the movable member; and opening and closing the temperature actuated valve based on a temperature of the fluid, wherein the at least one temperature actuated member is configured to compress causing the valve to reduce an opening to the second flow path when the fluid is at a first temperature and expand causing the valve to at least partially open to increase an opening to the second flow path when the fluid is at a second temperature.

BRIEF DESCRIPTION OF THE DRAWINGS

The drawings, described below, are for illustrative purposes and are not necessarily drawn to scale. The drawings are not intended to limit the scope of the disclosure in any way.

DETAILED DESCRIPTION

Figure 1:
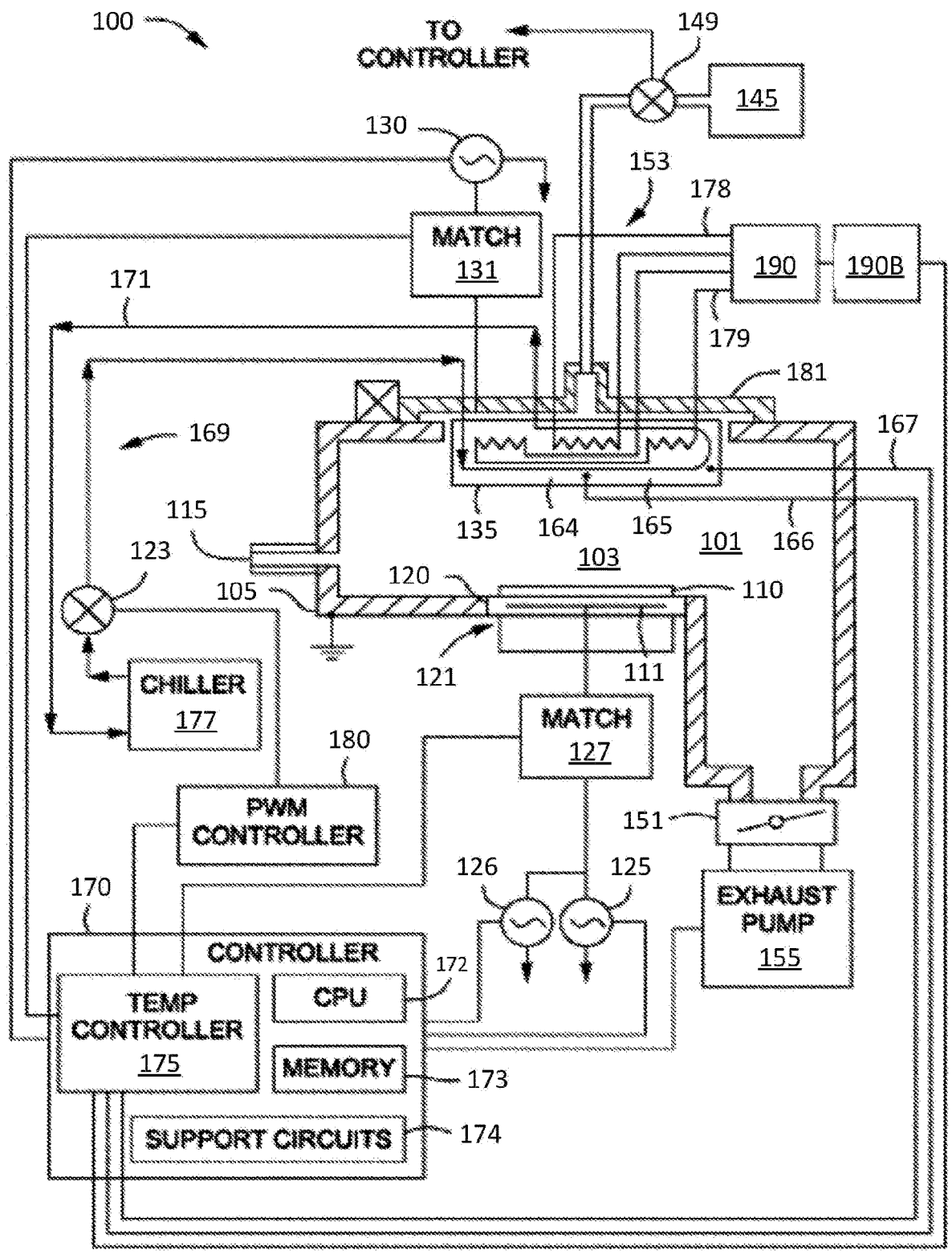
FIG. 1 illustrates a process chamber suitable for use with a temperature actuated valve in accordance with some embodiments.

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Semiconductor manufacturers are interested in reducing the energy consumption of fabrication equipment during operation and reducing the overall cost of ownership of such fabrication equipment. Process chambers often include components that are cooled during processing. Cooling of the components may be performed by delivering a coolant through one or more channels in components of the process chamber. Typically, active valves (e.g., pneumatic valves and/or electric valves) are used to modulate the flow of the coolant. Such active valves consume electricity. Embodiments described herein cover temperature actuated valves that do not require any active components (e.g., that do not require electricity or power consumption) for actuation. Use of such temperature actuated valves can reduce the energy footprint of semiconductor fabrication equipment. The temperature actuated valves can open and close (e.g., increase a size of one or more flow channels and/or decrease a size of one or more flow channels) based on a temperature of a fluid passing through the temperature actuated valves. Thus, when a coolant or other liquid has an elevated temperature, then the elevated temperature may cause the valve to be automatically opened and the size of flow channels may be increased to increase a flow of the coolant. In contrast, when a coolant or other liquid has a reduced temperature, then the reduced temperature may cause the valve to be automatically closed and the size of flow channels may be decreased to decrease a flow of the coolant. Such actuation of the flow value may be performed automatically for controlling a coolant flow without the use of additional sensors, active or powered components and/or a control system. Accordingly, use of the temperature actuated valves can reduce an overall energy consumption of equipment, such as semiconductor processing equipment.

According to one or more embodiments herein, disclosed is a temperature actuated valve (e.g., a spool valve) assembly positioned, for example, in the return line of a coolant flow loop of semiconductor fabrication equipment. Valves as described in embodiments herein utilize temperature responsive shape memory alloy springs that actuate when the coolant temperature exceeds an actuation temperature. The temperature actuated valve may include one or more shape memory alloy springs, one or more bias springs and related mechanical structures to support these springs. The valve may be restored to its original position by the bias springs when the temperature reduces below the return actuation temperature.

The temperature actuated valve may be a passive system, which actuates based on the temperature of the entering and/or exiting coolant and does not rely on an external sensor or actuator. In embodiments, the temperature responsive shape memory alloy springs operate the valve when the coolant temperature exceeds the actuation temperature. The valve may be restored to its original position with the help of bias springs when the temperature reduces beyond the return actuation temperature. In some embodiments, the amount of expansion and/or contraction of the shape memory allow springs is dependent on a temperature of the liquid (e.g., of the coolant). In such embodiments, rather than having merely an open position and a closed position, the temperature actuated valve may have many intermediate positions associated with different flow path opening sizes. As a result, a size of a flow path provided by the valve may be automatically adjusted passively based on a temperature of the liquid.

Because the temperature actuated valve operates based on the return temperature of the coolant in embodiments (i.e., a temperature of the coolant after the coolant has been used for cooling), it does not rely on the operating recipe of the corresponding semiconductor manufacturing equipment in embodiments. The temperature actuated valve, having the shape memory alloy springs, can function without the use of a control system or tuning of the temperature actuated valve and/or of a control system. The temperature actuated valve as described in embodiments herein is a robust design having valve actuation and reset points pre-designed to the system. In some embodiments, adjustment to actuation and reset temperatures can be implemented during setup of the valve in the field by manipulating a preloaded tension in the bias spring.

In some embodiments, the temperature actuated valve can be sized based on a maximum cooling specification and can modulate coolant flow. The ability to modulate coolant flow based on the cooling specification provides an opportunity to save energy and thus reduce tool operating cost.

FIG. 1 illustrates a process chamber 100 suitable for use with a temperature actuated valve in accordance with one or more embodiments described herein. The process chamber may be any type of chamber, for example an etch chamber, a deposition chamber, a transfer chamber and so on. In some embodiments, the process chamber 100 includes a grounded chamber body 105 defining an inner volume 101 which may include a processing volume 103. In one or more embodiments, the processing volume 103 may be defined as an area disposed between a substrate support 121, configured to receive and hold a substrate 110 during processing, and a showerhead 135 disposed within the inner volume 101. A vacuum pump 155 may be coupled to the inner volume 101 via an exhaust valve 151 to facilitate evacuation of the inner volume 101.

In embodiments, the substrate 110 may be loaded through an opening 115 in the chamber body 105 via a substrate transfer robot (not shown) and provided to the substrate support 121. In one or more embodiments, the substrate support 121 may include one or more mechanisms to retain the substrate 110 atop the substrate support 121, for example such as an electrostatic chuck 110. The substrate 110 may be any type of substrate conventionally employed in the plasma processing art and the inventive methods disclosed herein are not limited in this respect.

In some embodiments, the process chamber 100 may include a plasma power source (e.g. RF source 130) coupled to an upper electrode (e.g. a conductive portion of the chamber ceiling 181, the showerhead 135, or the like) via a match network 131 to inductively or capacitively provide power to form a plasma in the processing volume 101 of the process chamber 100.

A plasma source power 130 is coupled through a match 131 to a plasma-generating element to provide high frequency source power to inductively or capacitively energize the plasma. To facilitate control of the process chamber 100, a controller 170 may be coupled to the process chamber. The controller 170 may be one of any form of general-purpose computer processor that can be used in an industrial setting for controlling various chambers and sub-processors. The memory, or computer-readable medium 173 of the CPU 172 may be one or more of readily available memory such as random access memory (RAM), read only memory (ROM), floppy disk, hard disk, or any other form of digital storage, local or remote. The support circuits 174 are coupled to the CPU 172 for supporting the processor in a conventional manner. These circuits include cache, power supplies, clock circuits, input/output circuitry and subsystems, and the like.

In some embodiments, the process chamber 100 may include a showerhead 135 configured to provide one or more process gases supplied from a gas supply 145 via a mass flow controller 149 to the inner volume 101. In one or more embodiments, the showerhead 135 may be a temperature controlled showerhead having one or more heating zones (center or inner heating zone 164 and edge or outer heating zone 165 shown) wherein each zone is independently controllable. Although shown having two zones, the showerhead 135 may have any amount of zones, for example such as one zone, or three or more zones.

In some embodiments, each of the one or more heating zones may include a heater 153 having one or more electrically resistive heating elements 178, 179 coupled to a heater element 190. The heater element 190 may be coupled to a heater driver 190B and controlled by a temperature controller 175. The heating elements 178, 179 may be independently driven based on one or more temperature sensors 166 and 167 (e.g., an optical probe in each of the heating zones 164, 165). The heater driver 190B may be a solid state relay or a semiconductor controlled rectifier (SCR), for example. In some embodiments, the heater controller 191 provides pulse wave modulation (PWM) functionality analogous to a coolant liquid PWM controller 180 to interface the temperature controller 175 with either or both of the heating elements 178, 179 and a coolant loop 171.

Alternative to, or in combination with, the one or more heating zones, in some embodiments, the process chamber 100 may include a coolant system 169 having one or more coolant loops 171 to facilitate control over the temperature of, for example, showerhead 135 and/or a substrate support (e.g., an electrostatic chuck). In some embodiments, the coolant system 169 includes a chiller 177 to provide a cooling power to the showerhead 135 via the coolant loop 171 thermally coupling the showerhead 135 with the chiller 177. In operation, a coolant (e.g., 50% ethylene glycol, water, etc.) is passed through one or more coolant channels embedded in both the inner heating zone 164 and outer heating zone 165 (e.g., entering proximate to a first zone and exiting proximate to the other zone) of the showerhead 135. In one embodiment, the flow rate of the coolant through the one or more coolant loops 171 and one or more coolant channels is controlled by a pulse wave modulation controller 180 via one or more temperature actuated valves (one valve 123 shown) according to embodiments herein. Alternatively, or additionally, in embodiments a temperature actuated valve is used to control a flow rate of the coolant through the one or more coolant loops. The temperature actuated valve may be a passively actuated valve that does not rely on a sensor, a controller or a power source.

According to various embodiments, a temperature actuated valve may be positioned in, for example, coolant loop 171. Although described with respect to coolant loop 171, it is understood that the temperature actuated valve according to embodiments herein may be installed in any fluid line and/or pipe through which a variable temperature fluid flows. The fluid may be a heat transfer fluid, for example, a liquid or a gas suitable for adding or removing heat from a medium or component, and so on. The temperature actuated valve is temperature driven and can function with any chemically compatible fluid or temperature change (e.g., ambient temperature change) within an electronic device manufacturing system. The temperature actuated valve is suitable for use in a fluid line where it is beneficial to change fluid flow rate based on the temperature of the fluid. Suitable fluids include, but are not limited to, liquid water, purified liquid water, water vapor, a glycol, ethylene glycol, propylene glycol, liquid nitrogen, nitrogen gas, air, argon, liquid helium, helium gas or compatible mixtures of any two or more of the foregoing.

Changes in temperature of coolant flowing through coolant line 171 will correspondingly warm and/or cool the one or more temperature actuated members within the valve causing the valve to actuate or de-actuate in conjunction with one or more bias member. Actuation and de-actuation of the temperature actuated valve according to embodiments herein will occur without the use of sensors or a controller. The physical properties of the coolant and an alloy of the temperature actuated valve initiate actuation (or de-actuation) of the valve. During processing conditions that call for cooling (or call for increased cooling), the temperature of the coolant rises as the coolant absorbs heat energy and causes the one or more temperature actuated member within the valve to expand and open or increase flow through the valve. When processing conditions do not call for cooling (or call for less cooling), however, the temperature of the coolant decreases, which causes the temperature actuated member to contract (or compress) and close the valve (or reduce a size of an opening through which the coolant flows) to reduce the coolant flow. In some embodiments, the temperature actuated valve operates in an on (i.e., fully open) or off (i.e., fully closed) configuration. In one or more embodiments, the valve may be configured to partially open, for example, to control flow rate. Accordingly, in some embodiments, an opening size may be variable based on a temperature of the coolant.

Figure 2A:
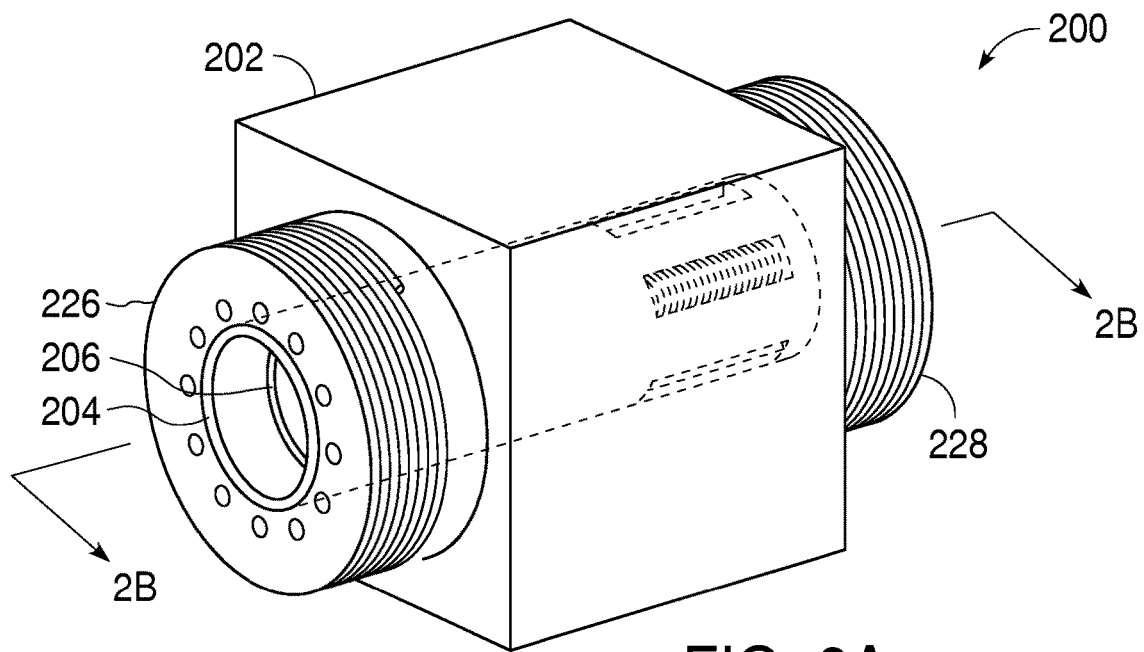
FIG. 2A illustrates a temperature actuated valve according to various embodiments of the disclosure.
Figure 2B:
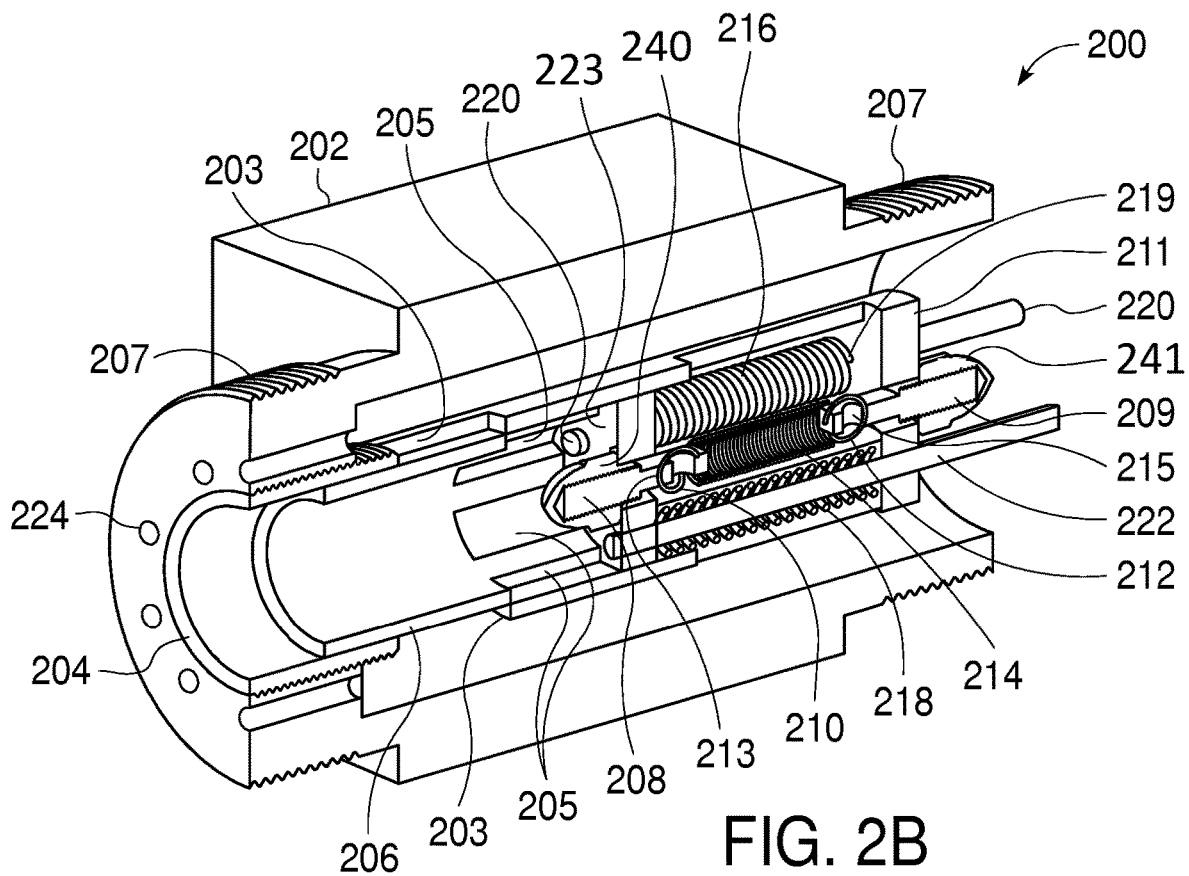
FIG. 2B illustrates a cross-section of a temperature actuated valve according to various embodiments of the disclosure.

An embodiment of a temperature actuated valve 200 is shown in FIGS. 2A and 2B. Inner components of the valve 200 are positioned within a housing 202. Housing 202 can include connecting members 207 configured to attach to two sections of a fluid line and/or pipe. That is, the temperature actuated valve 200 can be installed in-line with the pipe and/or fluid line. In some embodiments, the interior surface of housing 202 has a cylindrical shape and/or a shape consistent with the interior surface of the fluid line and/or pipe. The interior surface of housing 202 may have received therein a stationary member 204. In some embodiments, at least a portion of an outer surface of the stationary member 204 is spaced apart from at least a portion of an inner surface of housing 202 to define a first flow path therethrough. A first flow path (e.g., outer annular flow path) can be defined within the space between the outer surface of stationary member 204 and an inner surface of housing 202. In some embodiments, the outer annular flow path has the same diameter opening for a certain segment of the flow, whether the valve 200 is in the open or closed position. For example, the outer annular flow path may have a fixed open position. The resulting flow through the outer annular flow path can be a choke flow (e.g., a first flow rate) providing a certain back pressure in some embodiments. A second flow path of the temperature actuated valve 200 may be an inner annular flow path disposed within may be within a moveable member 206 positioned within the stationary member 204. When the inner annular flow path opens, fluid may flow through both the outer annular flow path and the inner annular flow path, and back pressure may be reduced, resulting in a high flow (e.g., a second flow rate that is higher than the first flow rate).

Figure 2C:
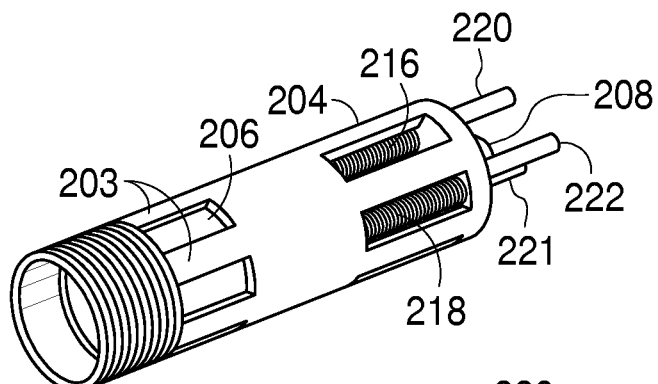
FIG. 2C illustrates internal components of a temperature actuated valve according to various embodiments of the disclosure.
Figure 2D:
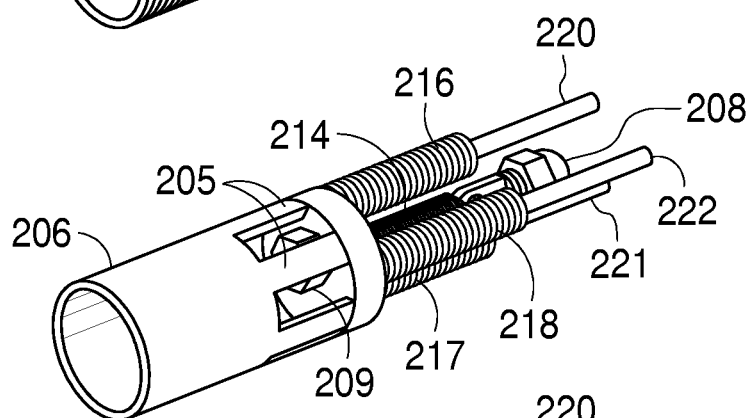
FIG. 2D illustrates a movable member together with temperature actuated members and other internal components of a temperature actuated valve according to various embodiments of the disclosure.
Figure 2E:
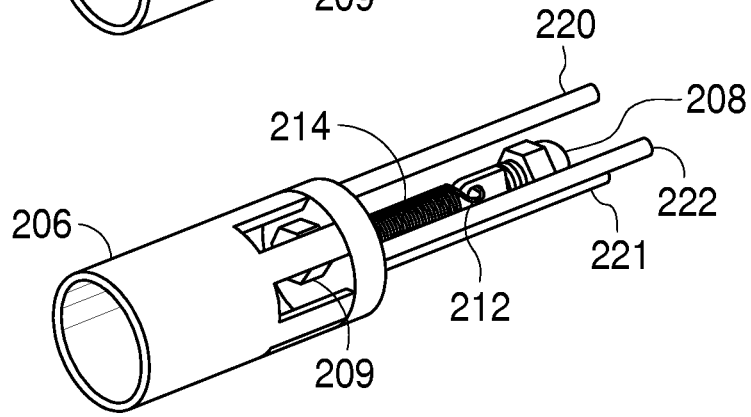
FIG. 2E illustrates a movable member together and other internal components of a temperature actuated valve according to various embodiments of the disclosure.
Figure 2F:
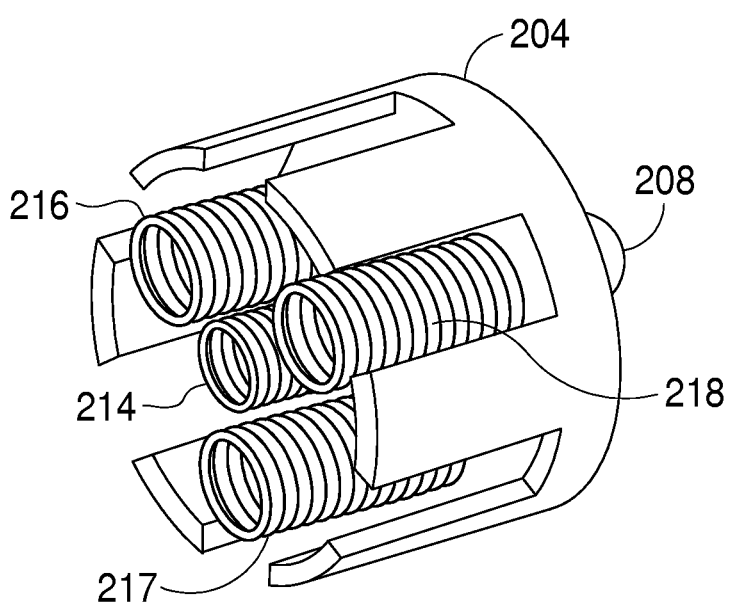
FIG. 2F illustrates a cross-section of a stationary member together with temperature actuated members and a bias member of a temperature actuated valve according to various embodiments of the disclosure.

Temperature actuated valve 200 can include movable member 206 received within stationary member 204 (e.g., a router spool) as shown in FIGS. 2A-2C. Stationary member 204 and movable member 206 each may have a cylindrical shape such that movable member 206 is configured to movably slide within stationary member 204. The second flow path may be defined by and within movable member 206. For example, stationary member 204 can include one or more flow elements 203. The one or more flow elements 203 can be openings, orifices, holes, perforations, divots, protrusions, fins, louvers, roughness elements, roughened surfaces, or a combination of any two or more of the foregoing. Movable member 206 similarly can include one or more flow elements 205. The one or more flow elements 205 can be openings, orifices, holes, perforations, divots, protrusions, fins, louvers, roughness elements, roughened surfaces, or a combination of any two or more of the foregoing. As will be described in more detail with respect to FIGS. 3A-5B, the one or more flow elements 203 of stationary member 204 are configured to at least partially align with the one or more flow elements 205 of moving member 206 to permit fluid flowing through the first flow path, to enter the interior of moving member 206 to form the second flow path.

Temperature actuated valve 200 may further include at least one temperature actuated member 216, 217, 218. Each temperature actuated member 216, 217, 218 independently may be in the form of a spring, coil spring, bellows spring, Belleville spring, plate spring or spring cylinder. In some embodiments, each temperature actuated member 216, 217, 218 is a coil spring. During operation, the temperature actuated members 216, 217, 218 may be wetted and in direct contact with the fluid flowing therethrough.

In one or more embodiments, the at least one temperature actuated member 216, 217, 218 may be formed of a shape memory alloy. In some embodiments, the shape memory alloy includes, but is not limited to, nickel, titanium, iron, copper and combinations thereof. Suitable shape memory alloys include, but are not limited to, a benevolent alloy, a nickel-titanium alloy, anickel-titanium-cobalt alloy, a nickel-titanium-copper alloy or combinations thereof. The shape memory alloy is configured to cause the temperature actuated member 216, 217, 218 to at least partially expand at a first temperature and to at least partially contract at a second temperature. The term "expand" as used herein refers to an increase in stiffness of the shape memory alloy material. The term "contract" or "compress" refers to a decrease in the stiffness of the shape memory alloy material. In one or more embodiments, the first temperature is at about 40° C. to about 90° C., or any individual value or sub-range within this range. In one or more embodiments, the second temperature is at about 12° C. to about 40° C., or any individual value or sub-range within this range. Temperature actuated members 216, 217, 218 each may be supported by a corresponding guiding member 220, 221, 222. Guiding members 220, 221, 222 are configured to move linearly together with moving member 206. As temperature actuated members 216, 217, 218 expand and contract, the guiding members 220, 221, 222 ensure linear (and not lateral) movement of members 216, 217, 218.

Each temperature actuated member 216, 217, 218 can include a first end 219 seated against a base 211 of stationary member 204 and a second end seated against a base 223 of movable member 206. Each guiding member 220, 221, 222 may be received within an opening and secured to base 223 as shown FIGS. 2B, 2D, 2E, 2F. In some embodiments, each guiding member 220, 221, 222 is secured to base 223 by any suitable means, including, but not limited to, a screw, bolt, rivet, machined notch, welding, soldering, glue, etc. When temperature actuated members 216, 217, 218 expand, they push against base 223 causing movable member 206 to move in the direction of the force, aligning flow elements 203, 205.

In some embodiments, the temperature actuated valve 200 further includes at least one bias member 214. The at least one bias member may have the form of a spring, coil spring, bellows spring, Belleville spring, plate spring or spring cylinder. In some embodiments, bias member 214 is a coil spring. In some embodiments, the temperature actuated members 216, 217, 218 work against the bias member 214 (e.g., bias spring) providing a load or tension between these elements. Bias member 214 may be configured to return the movable member 206 and the one or more temperature actuated members 216, 217, 218 to a first position (e.g., a closed position) when a temperature of the liquid is below a temperature threshold. For example, when the fluid flowing through the temperature actuated valve 200 reaches or drops below a certain threshold temperature the shape memory alloy of the extended temperature actuated members 216, 217, 218 contracts and bias member 214 returns the temperature actuated members to the first position.

According to one or more embodiments, bias member 214 can include attachment members 210, 212 on opposite ends thereof. Attachment member 210 may be, for example, a hook, a wire, a coil, etc., configured to pass through an opening 213 of post 208, which is configured to pass through base 223. In some embodiments, post 208 may have a threaded portion that is configured to attach to a nut 240 to secure post 208 and bias member 214 to movable member 206. Attachment member 212, for example, a hook, a wire, a coil, etc., may be configured to pass through an opening 215 of a post 209, which is configured to pass through base 211. In some embodiments, post 209 may have a threaded portion that is configured to attach to a nut 241 to secure post 209 and bias member 214 to fixed member 204. In one or more embodiments, by choosing a suitable shape memory alloy material and bias member 214 material stiffness, the temperature at which the valve 200 opens and closes can be controlled.

In some embodiments, temperature actuated valve 200 further includes an adjusting member attached to bias member 214. Adjusting member may be operable to adjust tension in bias member 214. In some embodiments, nut 241 may be the adjusting member. Nut 241 can be tightened to increase tension in bias member 214 or loosened to decrease tension in bias member 214. The pretension adjusting nut may be designed with an operating design table having some markings around the edge so a user knows where to set the nut (i.e., as a continuous dial, or step change dial). With a step change dial, the nut may have be a latch or pawl ratchet design so that the user can jump from one setting to another setting.

According to one or more embodiments, components of the temperature actuated valve 200, particularly wetted components, are comprised of a non-corrosive metal, polymer, ceramic, combinations thereof or any other suitable solid material. In some embodiments, stationary member 203, movable member 206, housing 202 and bias member 214 (e.g., including components 208, 209, 210, 212, 213, 217, 221) each independently comprises stainless steel, plastic, copper, brass, bronze, aluminum, nickel-cobalt alloy, iron or a combination of any of the foregoing. In some embodiments, stationary member 203, movable member 206 and housing 202 are formed of a 316 stainless steel alloy. In some embodiments, bias member 214 is formed of a stainless steel alloy other than 316 stainless steel alloy, plastic, copper, brass, bronze, aluminum, nickel-cobalt alloy, iron or a combination of any of the foregoing.

Figure 3A:
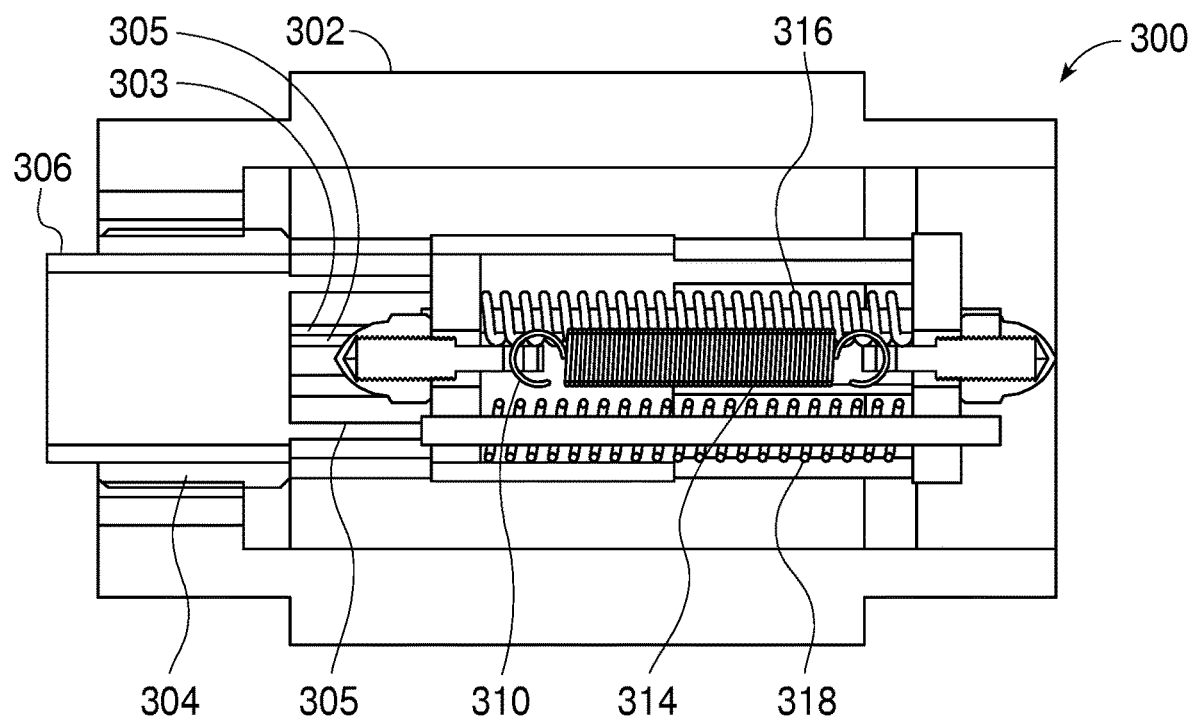
FIG. 3A illustrates a temperature actuated valve having the temperature actuated members in an extended configuration according to various embodiments of the disclosure.
Figure 3B:
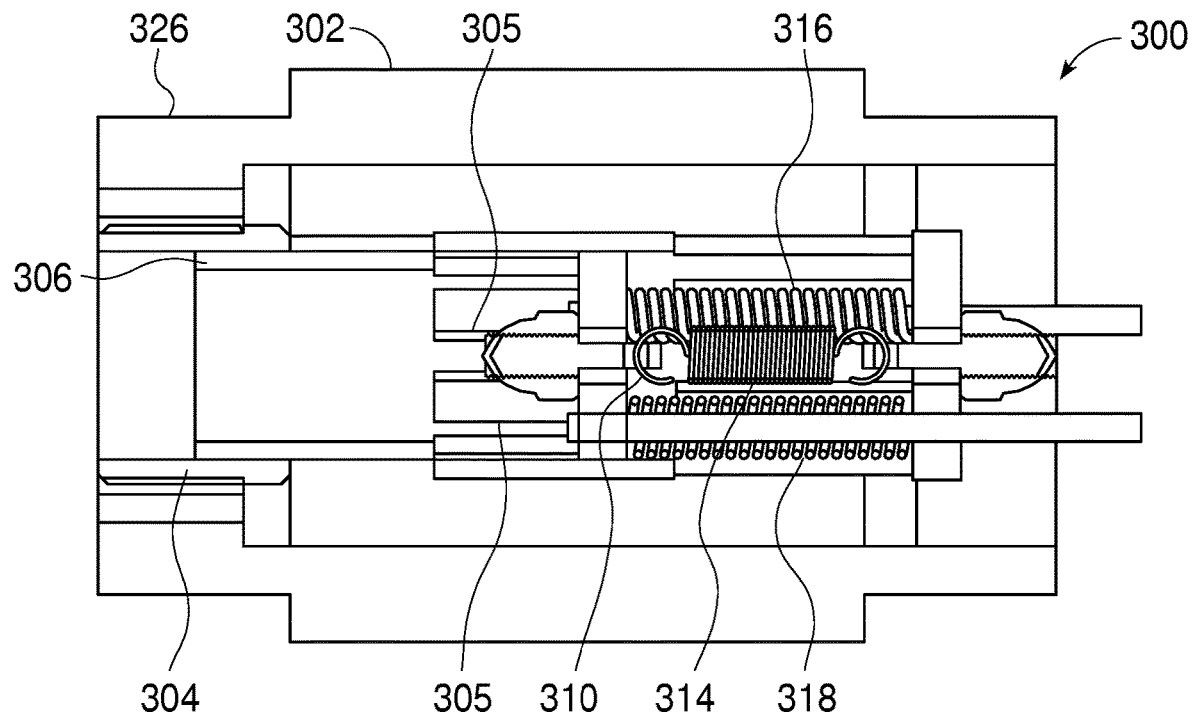
FIG. 3B illustrates a temperature actuated valve having the temperature actuated members in a compressed configuration according to various embodiments of the disclosure.

FIGS. 3A and 3B show a temperature actuated valve 300 having temperature actuated members 316, 318 in expanded (FIG. 3A) and contracted (FIG. 3B) positions. For example, when fluid flowing through valve 300 reaches a first temperature, the shape memory alloy of temperature actuated members 316, 318 expands causing the temperature actuated members to stretch thereby opening valve 300. When temperature actuated members 316, 318 expand, they apply a force to movable member 306. Movable member 306 moves linearly within fixed member 304 to align openings 305 of movable member 306 with openings 303 of fixed member 304. Once openings 303, 305 are aligned, fluid flowing by an outer surface of fixed member 304, between an inner surface of housing 302 and fixed member 304, flows through openings 303, 305 and through an interior of movable member 306. Movable member 306 may be concentrically enclosed within the interior of fixed member 304 forming annular flow paths. Once valve 300 opens, the fluid flowing therethrough is able to enter the larger volume of the interior of movable member 306 thereby increasing flow rate.

When the fluid flowing through valve 300 reaches a second temperature, the shape memory alloy of temperature actuated members 316, 318 contracts (FIG. 3B) causing the temperature actuated members to compress thereby closing valve 300. When temperature actuated members 316, 318 compress, bias member 314 proceeds to return to its original shape, pulling movable member 306 back toward its closed position. Movable member 306 moves linearly within fixed member 304 and once it re-engages with attachment member 310 of bias member 314, it misaligns and closes off openings 305 from openings 303. Once openings 303, 305 are closed, fluid flowing through the interior of movable member 306 stops. In some embodiments, the fluid begins flowing past the outer surface of fixed member 304 thereby reducing the flow rate.

Although described as a binary (i.e., open/closed) configuration, in some embodiments, the shape memory alloy expands and contracts as a function of the temperature of the fluid. As such, the temperature actuated members 316, 318 may expand or contract to partially align openings 303, 305 providing a flow rate in-between when valve 300 is fully opened or fully closed. In some embodiments, the shape memory alloy expands and contracts linearly or non-linearly as a function of temperature.

Figure 4A:
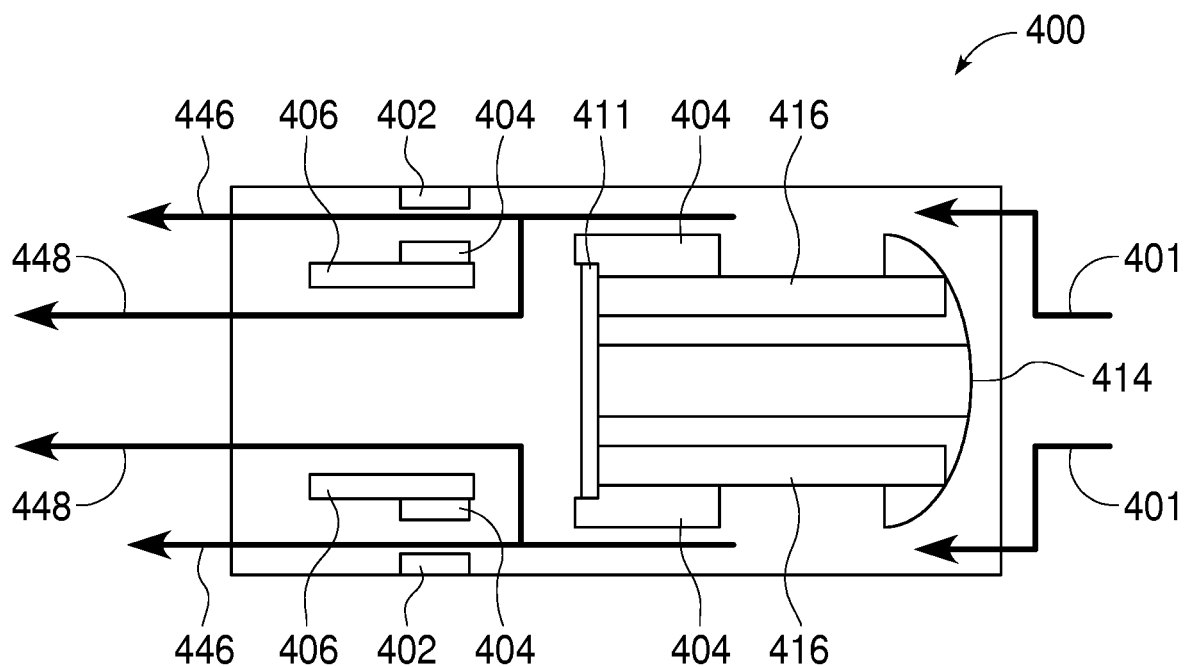
FIG. 4A illustrates a flow path through an "open" temperature actuated valve according to embodiments of the disclosure.
Figure 4B:
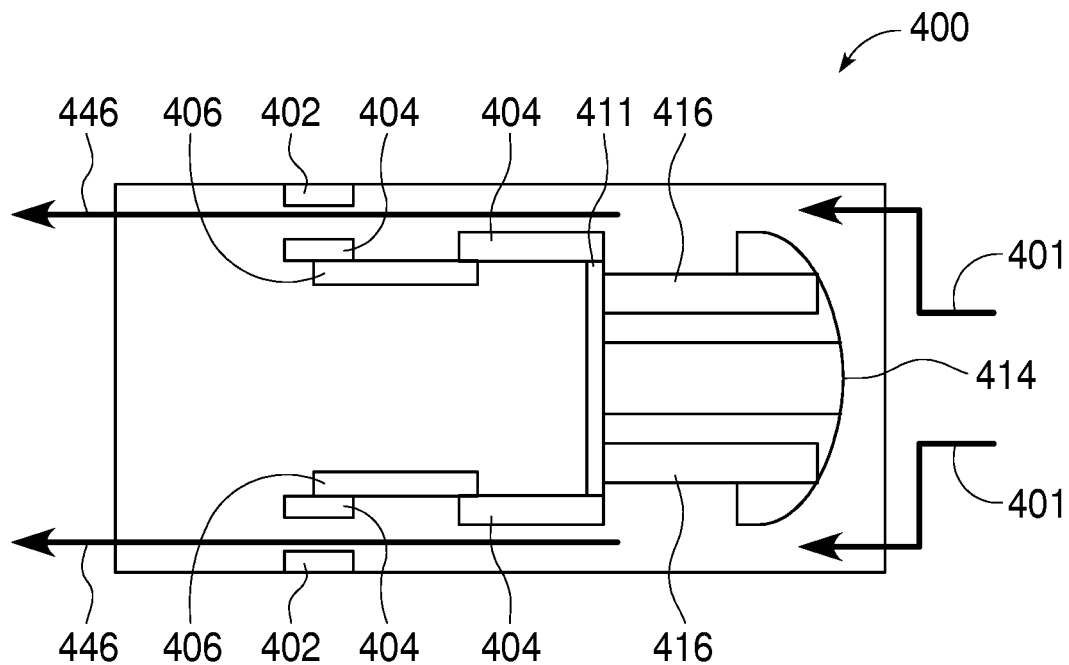
FIG. 4B illustrates a flow path through a "closed" temperature actuated valve according to embodiments of the disclosure.

FIGS. 4A and 4B show the flow paths of fluid through a temperature actuated valve 400, according to one or more embodiments described herein, when in an open (FIG. 4A) and a closed (FIG. 4B) configuration. When temperature actuated valve 400 is in an open position, fluid flow path 401 is formed within the interior of valve 400 between an outer surface of fixed member 404 and an inner surface of housing 402. Temperature actuated members 416, 418, attached to base 411, are configured to at least partially expand when fluid flowing in fluid flow path 401 is at a first temperature. The first temperature may be about 40° C. to about 90° C., or any individual value or sub-range within this range. The expansion of temperature actuated members 416, 418 causes movable member 406 to move linearly within fixed member 404, aligning the openings of fixed member 404 with those of movable member 406. Fluid flow path 401 then divides such that it continues 446 past an outer surface of fixed member 404 and fluid also flows through the openings of members 404, 406 and into an interior volume of movable member 406 creating flow path 448.

When temperature actuated valve 400 is in a closed position (FIG. 4B), fluid flow path 401 is formed within the interior of valve 400 between an outer surface of fixed member 404 and an inner surface of housing 402. Temperature actuated members 416, 418, attached to base 411, are configured to at least partially contract when fluid flowing in fluid flow path 401 is at a second temperature. The second temperature may be about 12° C. to about 40° C., or any individual value or sub-range within this range. The contraction of temperature actuated members 416, 418 causes movable member 406 to move linearly within fixed member 404, closing off the openings of fixed member 404 with those of movable member 406. Fluid flow path 401 then continues 446 past the outer surface of fixed member 404 and does not flow through flow path 448. In some embodiments, the shape memory alloy material of temperature actuated members 416, 418 expands and contracts predictably as a function of temperature. As such, valve 400 can be configured to partially open or partially close providing further functionality with respect to controlling flow rate of a fluid flowing therethrough.

Figure 5A:
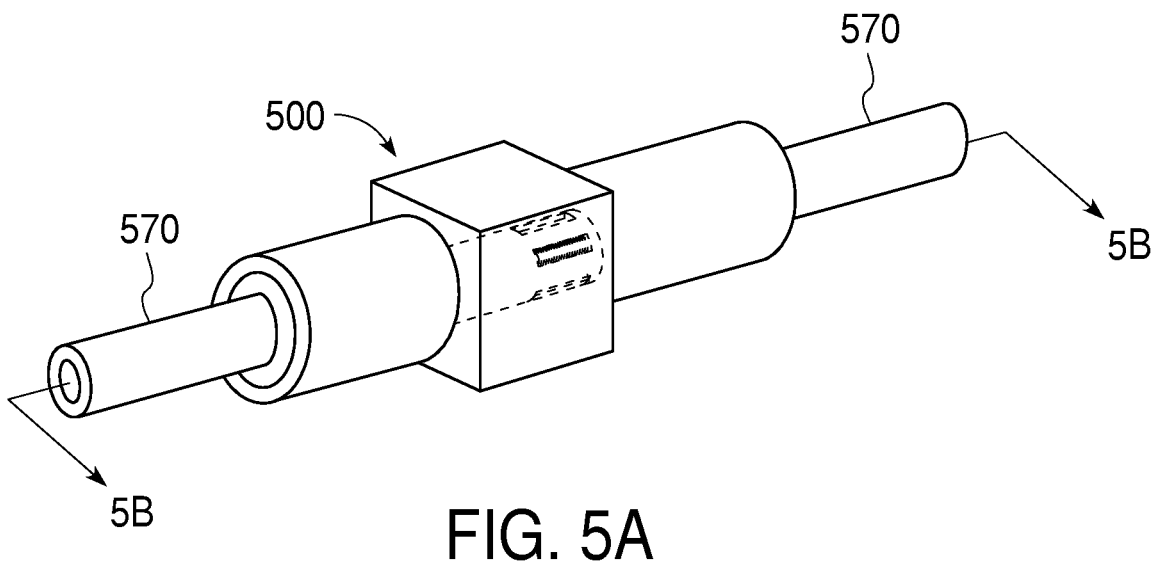
FIG. 5A illustrates a temperature actuated valve installed in a fluid line according to embodiments of the invention.
Figure 5B:
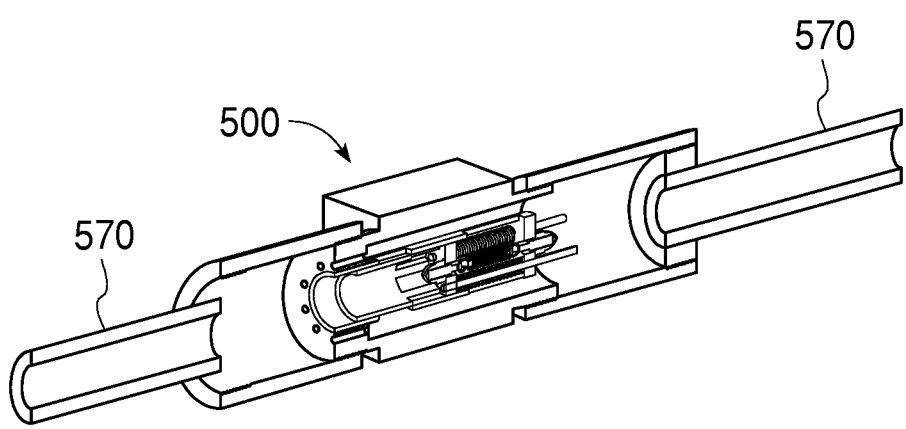
FIG. 5B illustrates a cross-section of a temperature actuated valve installed in a fluid line according to embodiments of the invention.

According to one or more further embodiments, disclosed herein is an electronic device manufacturing system having a fluid line 570, as shown in FIGS. 5A and 5B, with a temperature actuated valve 500 as set forth in one or more embodiments described herein. In embodiments, the fluid flowing through fluid line 570 has a variable temperature sufficient to cause the shape memory alloy of the one or more temperature actuated members 516, 518 to expand and contract and consequently at least partially open and at least partially close valve 500. For example, the temperature of the fluid flowing through line 570 may be about 10° C. to about 120° C., or any individual value or sub-range within this range. In one or more embodiments, the fluid is a coolant. Suitable fluids include, but are not limited to, liquid water, purified liquid water, water vapor, a glycol, ethylene glycol, propylene glycol, liquid nitrogen, nitrogen gas, air, argon, liquid helium, helium gas or compatible mixtures of any two or more of the foregoing.

The temperature actuated valve 500 can be readily installed within a fluid line 570 of the electronic device manufacturing system using, for example, threaded connectors and piping. Although shown in FIGS. 5A and 5B with in-line threaded connectors it is understood that any suitable valve end connectors may be used including, but not limited to, pipe threads, socket welds, butt welds, soldered, glue sockets, flange, tri-clamp, compression, push-in, barbed hose, union/true union, manifold mount and combinations thereof.

An electronic device manufacturing system operating with a temperature actuated valve 200, 300, 400, 500 according to various embodiments herein, may reduce consumption of fluids, in particular, fluids having a variable temperature used to heat or cool a device, chemical and/or process. In some embodiments, the installation of a temperate actuated valve 200, 300, 400, 500 in a variable temperature fluid line (e.g., a coolant line) of an electronic device manufacturing system may reduce fluid consumption by about 10% to about 50%, or any individual-value or sub-range within this range. In some embodiments, the installation of a temperate actuated valve 200, 300, 400, 500 in a variable temperature fluid line (e.g., a coolant line) of an electronic device manufacturing system may reduce the energy demand by about 1% to about 99%, or any individual-value or sub-range within this range.

In some embodiments, an electronic device manufacturing system operating with a temperature actuated valve 200, 300, 400, 500 according to various embodiments herein, can have a reduction in the amount of water consumed by the system providing a reducing in environmental and health impacts. Companies and governments continue to seek was to reduce the environmental health and safety cost of semiconductor equipment making such equipment and related processes sustainable in the long-term. In addition to the reduction in water consumed by such systems, the supporting equipment and processes also experience a reduction in the power and energy needed to circulate the water.

Figure 6:
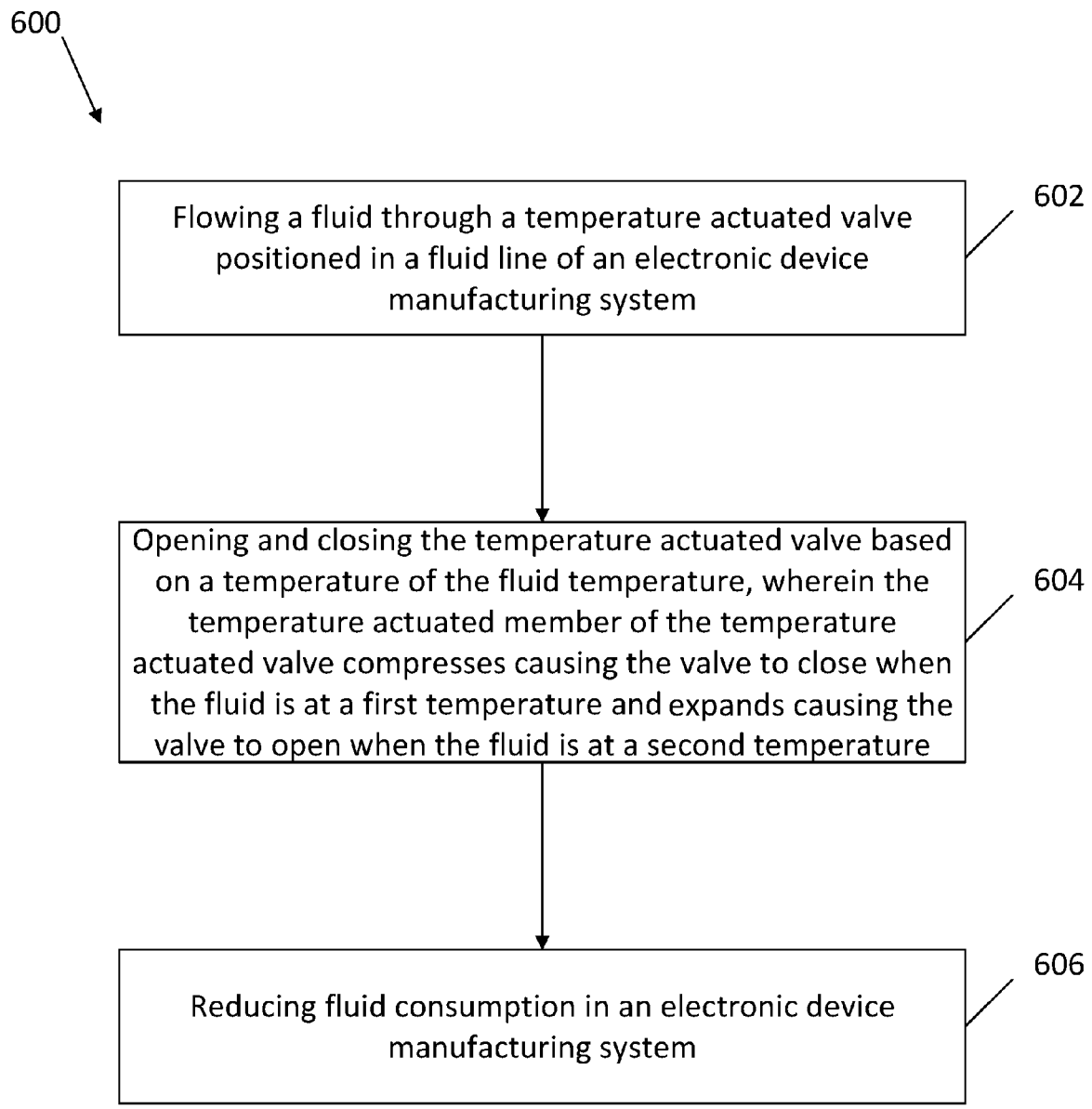
FIG. 6 illustrates a flowchart of a method of reducing fluid consumption in an electronic device manufacturing system according to embodiments of the invention.

FIG. 6 is a block diagram showing a method 600 of reducing fluid consumption in an electronic device manufacturing system. At block 602 the method includes flowing a fluid through a temperature actuated valve according to one or more embodiments described herein. In some embodiments, the fluid is a coolant. Suitable fluids include, but are not limited to, liquid water, purified liquid water, water vapor, a glycol, ethylene glycol, propylene glycol, liquid nitrogen, nitrogen gas, air, argon, liquid helium, helium gas or compatible mixtures of any two or more of the foregoing.

At block 604, the method 600 includes opening and closing the temperature actuated valve based on a temperature of the fluid. According to embodiments, when the temperature of the fluid is at a first temperature, the at least one temperature actuated member in the temperature actuated valve compresses causing the at least one temperature actuated member to contract. The contraction of the at least one temperature actuated member at least partially closes the openings of the movable member from the openings of the stationary member thereby reducing the fluid flow rate. In some embodiments, the first temperature is about 12° C. to about 40° C., or any individual value or sub-range within this range. When the temperature of the fluid is at a second temperature, the at least one temperature actuated member expands causing the at least one temperature actuated member to expand. The expansion of the at least one temperature actuated member at least partially aligns the openings of the movable member with the openings of the stationary member thereby increasing the flow rate of the fluid. In some embodiments, the second temperature is about 40° C. to about 90° C., or any individual value or sub-range within this range.

In some embodiments, at block 606 method 600 includes reducing fluid consumption in the electronic device manufacturing system. In one or more embodiments, the installation of a temperate actuated valve 200, 300, 400, 500 in a variable temperature fluid line (e.g., a coolant line) of an electronic device manufacturing system may reduce fluid consumption by about 10% to about 50%, or any individual-value or sub-range within this range. In some embodiments, the installation of a temperate actuated valve 200, 300, 400, 500 in a variable temperature fluid line (e.g., a coolant line) of an electronic device manufacturing system may reduce the energy demand by about 1% to about 99%, or any individual-value or sub-range within this range. In some embodiments, method 600 includes flowing a liquid having a first temperature, closing the temperature actuated valve, flowing a liquid having a second temperature, and opening the temperature actuated valve.

Reference throughout this specification to, for example, "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

As used herein, the singular forms "a," "an," and "the" include plural references unless the context clearly indicates otherwise. Thus, for example, reference to "a robot arm" includes a single robot arm as well as more than one robot arm.

As used herein, the term "about" in connection with a measured quantity, refers to the normal variations in that measured quantity as expected by one of ordinary skill in the art in making the measurement and exercising a level of care commensurate with the objective of measurement and the precision of the measuring equipment. In certain embodiments, the term "about" includes the recited number±10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Unless otherwise indicated, all parts and percentages are by weight. Weight percent (wt. %), if not otherwise indicated, is based on an entire composition free of any volatiles, that is, based on dry solids content.

The foregoing description discloses example embodiments of the disclosure. Modifications of the above-disclosed assemblies, apparatus, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the following claims.

What is claimed is:

1. A temperature actuated valve, comprising:
a stationary member and a movable member disposed within a housing, wherein the stationary member is configured to receive the movable member;
a first annular flow path defined between an outer surface of the stationary member and an inner surface of the housing;
a second flow path defined by and within the movable member;
at least one temperature actuated member comprising a first end seated against a base of the stationary member and a second end seated against a base of the movable member, wherein the at least one temperature actuated member comprises a shape memory alloy; and
a bias member comprising a first end connected to the base of the stationary member and a second end connected to the base of the movable member,
the at least one temperature actuated member configured to compress at a first temperature to reduce an opening to the second flow path and to expand at a second temperature to increase an opening to the second flow path.

2. The temperature actuated valve of claim 1, further comprising an adjusting member attached to the bias member, wherein the adjusting member is operable to adjust tension in the bias member.

3. The temperature actuated valve of claim 1, wherein the stationary member, the movable member, the housing and the bias member each independently comprises stainless steel, plastic, copper, brass, bronze, aluminum, nickel-cobalt alloy, iron or a combination of any two or more of the foregoing.

4. The temperature actuated valve of claim 1, wherein the shape memory alloy comprises at least one of a spring, coil spring, bellows spring, Belleville spring, plate spring or spring cylinder.

5. The temperature actuated valve of claim 1, further comprising at least one guiding member having a first end seated against the base of the stationary member and a second end seated against the base of the movable member, wherein the at least one guiding member passes through the at least one temperature actuated member.

6. The temperature actuated valve of claim 1, wherein the at least one temperature actuated member and the movable member each comprises a plurality of flow elements.

7. The temperature actuated valve of claim 6, wherein the plurality of flow elements comprise one or more of openings, orifices, holes, perforations, divots, protrusions, fins, louvers, roughness elements, roughened surfaces, or a combination of any two or more of the foregoing.

8. The temperature actuated valve of claim 1, wherein at least one of the at least one temperature actuated member or the bias member is in the form of a spring, coil spring, bellows spring, Belleville spring, plate spring or spring cylinder.

9. The temperature actuated valve of claim 1, further comprising a plurality of temperature actuated members and a plurality of corresponding guiding members, each guiding member having a first end seated against the base of the stationary member and a second end seated against the base of the movable member, wherein each of the plurality of guiding members passes through a corresponding temperature actuated member.

10. An electronic device manufacturing system, comprising:
a fluid line comprising a fluid having a variable temperature, the fluid line further comprising a temperature actuated valve comprising:
a stationary member and a movable member disposed within a housing, wherein the stationary member is configured to receive the movable member;
a first annular flow path defined between an outer surface of the stationary member and an inner surface of the housing;
a second flow path defined by and within the movable member;
at least one temperature actuated member comprising a first end seated against a base of the stationary member and a second end seated against a base of the movable member, wherein the at least one temperature actuated member comprises a shape memory alloy; and
a bias member comprising a first end connected to the base of the stationary member and a second end connected to the base of the movable member,
the at least one temperature actuated member configured to compress at a first temperature to reduce an opening to the second flow path and to expand at a second temperature to increase an opening to the second flow path.

11. The electronic device manufacturing system of claim 10, wherein the fluid is a coolant.

12. The electronic device manufacturing system of claim 10, further comprising an adjusting member attached to the bias member, wherein the adjusting member is operable to adjust tension in the bias member.

13. The electronic device manufacturing system of claim 10, wherein the stationary member, movable member, housing and bias member each independently comprises stainless steel, plastic, copper, brass, bronze, aluminum, nickel-cobalt alloy, iron or a combination of any two or more of the foregoing.

14. The electronic device manufacturing system of claim 10, wherein the shape memory alloy comprises at least one of nickel-titanium alloy, nickel-titanium-cobalt alloy, nickel-titanium-copper alloy, or combinations thereof.

15. The electronic device manufacturing system of claim 10, further comprising at least one guiding member having a first end seated against the base of the stationary member and a second end seated against the base of the movable member, wherein the at least one guiding member passes through the at least one temperature actuated member.

16. The electronic device manufacturing system of claim 10, wherein the at least one temperature actuated member and the movable member each comprises a plurality of flow elements.

17. The electronic device manufacturing system of claim 10, wherein at least one of the at least one temperature actuated member or the bias member is in the form of a spring, coil spring, bellows spring, Belleville spring, plate spring or spring cylinder.

18. The electronic device manufacturing system of claim 10, wherein the temperature actuated valve comprises a plurality of temperature actuated members and a plurality of corresponding guiding members, each guiding member having a first end seated against the base of the stationary member and a second end seated against the base of the movable member, wherein each of the plurality of guiding members passes through a corresponding temperature actuated member.

19. A method of reducing fluid consumption in an electronic device manufacturing system, comprising:

flowing a fluid through a temperature actuated valve positioned in a fluid line of the electronic device manufacturing system, the temperature actuated valve comprising:
- a stationary member and a movable member disposed within a housing, wherein the stationary member is configured to receive the movable member;
- a first annular flow path defined between an outer surface of the stationary member and an inner surface of the housing;
- a second flow path defined by and within the movable member;
- at least one temperature actuated member comprising a first end seated against a base of the stationary member and a second end seated against a base of the movable member, wherein the at least one temperature actuated member comprises a shape memory alloy; and
- a bias member comprising a first end connected to the base of the stationary member and a second end connected to the base of the movable member; and opening and closing the temperature actuated valve based on a temperature of the fluid, wherein the at least one temperature actuated member is configured to compress causing the valve to reduce an opening to the second flow path when the fluid is at a first temperature and expand causing the valve to at least partially open to increase an opening to the second flow path when the fluid is at a second temperature.

20. The method of claim 19, wherein the shape memory alloy comprises at least one of a nickel-titanium alloy, nickel-titanium-cobalt alloy, nickel-titanium-copper alloy, or combinations thereof.

* * * * *